(12) United States Patent
Arai

(10) Patent No.: US 8,294,527 B2
(45) Date of Patent: Oct. 23, 2012

(54) OSCILLATOR CIRCUIT

(75) Inventor: Kenji Arai, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 153 days.

(21) Appl. No.: 12/694,482

(22) Filed: Jan. 27, 2010

(65) Prior Publication Data

US 2010/0188159 A1    Jul. 29, 2010

(30) Foreign Application Priority Data

Jan. 28, 2009 (JP) .................. 2009-016437

(51) Int. Cl.
*H03K 3/354* (2006.01)

(52) U.S. Cl. ........ 331/117 FE; 331/108 R; 331/116 FE; 331/183

(58) Field of Classification Search ............... 331/107 R, 331/108 R, 109, 116 FE, 117 FE, 160, 183
See application file for complete search history.

(56) References Cited

U.S. PATENT DOCUMENTS 7,489,209 B2 *  2/2009 Mosesov ................ 331/167
2009/0027133 A1 *  1/2009 Seliverstov ............ 331/158
2009/0121799 A1 *  5/2009 Ishikawa ............ 331/116 R

FOREIGN PATENT DOCUMENTS

JP         2005303639 A    10/2005

* cited by examiner

*Primary Examiner* — Joseph Chang
*Assistant Examiner* — Jeffrey Shin
(74) *Attorney, Agent, or Firm* — Volentine & Whitt, PLLC

(57) ABSTRACT

There is provided an oscillator circuit including: a current source; a resonant unit; an oscillation amplification unit connected to the current source while being connected in parallel to the resonant unit; a feedback resistor connected in parallel to the oscillation amplification unit; a bypass resistor having a resistance lower than a resistance of the feedback resistor; a switch unit connected between the feedback resistor and the bypass resistor, and configured to switch to the feedback resistor or the bypass resistor; and a control unit configured to control the switch unit such that a current from the current source is bypassed to the bypass resistor during a predetermined oscillation starting period, and to control the switch unit such that the current from the current source flows to the feedback resistor after the predetermined oscillation starting period has ended.

14 Claims, 13 Drawing Sheets

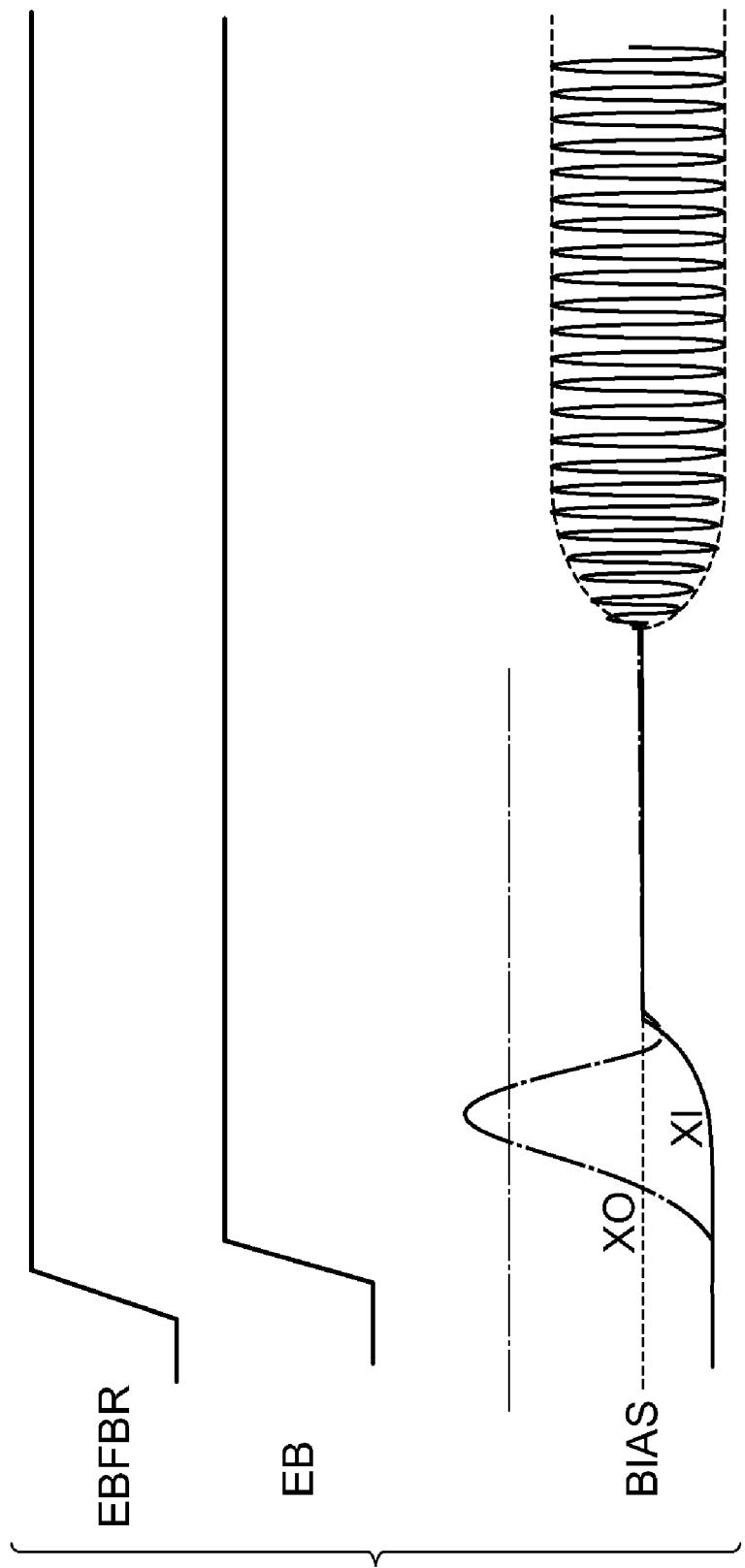

OSCILLATOR CIRCUIT

CROSS-REFERENCE TO RELATED APPLICATION

This application is based on and claims priority under 35 USC 119 from Japanese Patent Application No. 2009-016437 filed on Jan. 28, 2009, the disclosure of which is incorporated by reference herein.

BACKGROUND

1. Technical Field

The present invention relates to an oscillator circuit, and, particularly, to an oscillator circuit formed on a semiconductor integrated circuit and connected to a resonant circuit including a crystal unit, a ceramic resonator, an LC circuit and the like.

2. Related Art

According to the related art, an oscillator circuit formed on a semiconductor integrated circuit while being connected to a crystal unit so as to exhibit an oscillation has been used (see, for example, Japanese Patent Application Laid-Open (JP-A) NO. 2005-303639). In such an oscillator circuit, in order to lower a supply voltage and obtain a wide range and low current consumption when a battery is used, there has been proposed an oscillator circuit using a PTAT (Proportional Absolute Temperature) current source, which uses a reference current such as a bandgap current, and an inverter type oscillating buffer.

As the oscillator circuit according to the related art, in order to obtain an oscillation gain with a required magnitude under the low supply voltage, an oscillating inverting amplifier has been designed with a core transistor.

In a core transistor (for example, with a supply voltage of 1.8 V), as compared with an I/O (Input/Output) transistor (for example, with a supply voltage of 3.3 V) constituting an I/O circuit, it is typical for the thickness of a gate oxide layer to be thin and the breakdown voltage to be low. As compared with the I/O transistor, the core transistor can allow a desired current to flow at a lower voltage by the magnitude relation of the gate oxide layer. Thus, an oscillation gain with a desired magnitude can be ensured at a low supply voltage. That is, applying core transistor to this circuit is more adapted to low power consumption as compared with applying I/O transistor.

FIG. 12 shows one example of such an oscillator circuit. As shown in FIG. 12, the oscillator circuit 100 includes a PTAT current source 12, an oscillating buffer 14, an NMOS transistor 16, a feedback resistor Rf, switch devices 20A and 20B and an output buffer 22.

The PTAT current source 12 includes a bias current generating circuit 28, a current mirror circuit 38 and a PMOS transistor 40. The bias current generating circuit 28 includes a PMOS transistor 24, and a bandgap current source 26 provided with a diode and a bipolar device. The current mirror circuit 38 includes PMOS transistors 30 and 32 and NMOS transistors 34 and 36.

The oscillating buffer 14 includes a CMOS inverter formed by a PMOS transistor 42 and an NMOS transistor 44. A source of the PMOS transistor 42 is connected to a drain of the PMOS transistor 40. A source of the NMOS transistor 44 is connected to a drain of the NMOS transistor 16. A source of the NMOS transistor 16 is grounded. A gate of the NMOS transistor 16 is connected to an enable terminal EB.

The feedback resistor Rf is connected in parallel to the oscillating buffer 14. The switch device 20A is connected between one end of the feedback resistor Rf and an input side of the oscillating buffer 14. The switch device 20B is connected between the other end of the feedback resistor Rf and an output side of the oscillating buffer 14.

The switch devices 20A and 20B, for example, each include an NMOS transistor, and have gates connected to a feedback resistor enable terminal EBFBR. Further, the switch devices 20A and 20B may use a transfer gate including a PMOS transistor and an NMOS transistor.

The input side of the oscillating buffer 14, that is, the gates of the PMOS transistor 42 and the NMOS transistor 44 are connected to an input terminal XI. The output side of the oscillating buffer 14, that is, the drains of the PMOS transistor 42 and the NMOS transistor 44 are connected to an output terminal XO and an input terminal of the output buffer 22.

A resonant circuit 46 is connected to the input terminal XI and the output terminal XO. The resonant circuit 46 includes a crystal unit Xtal, external capacitors Cg and Cd, and a dumping resistor Rd. The dumping resistor Rd is provided to adjust a resistance value, thereby reducing the probability that the crystal unit Xtal will break when a level of drive (power from a current Id flowing when the external capacitor Cd is charged) of the oscillator circuit is higher than the power designated by the crystal unit Xtal.

Hereinafter, a typical oscillating operation of the oscillator circuit 100 will be described.

When the oscillator circuit starts to oscillate, as shown in FIG. 13, a control signal input to the feedback resistor enable terminal EBFBR is changed from a low level (hereinafter, referred to an L level) to a high level (hereinafter, referred to an H level) and a control signal input to the enable terminal EB is changed from an L level to an H level, so that the PTAT current source 12 starts to operate.

Thus, the NMOS transistor 16 is turned on and the switch devices 20A and 20B are turned on. The PTAT current source 12 allows a bias current Ibg generated by the bias current generating circuit 28 and a current Iall set by the current mirror circuit 38 to flow.

Thereafter, voltage levels of each node (terminal) are changed as follows. First, when the voltage level of the output terminal XO in its initial state is 0 [V] level, the current Iall flows toward the external capacitor Cd from the PTAT current source 12 and is stored in the external capacitor Cd, so that the voltage level of the output terminal XO is increased as indicated by dashed dotted lines of FIG. 13.

If the voltage level of the output terminal XO is increased, the current from the PTAT current source 12 flows toward the input terminal XI through the feedback resistor Rf (for example, a resistance value thereof is about 1MΩ). As a result, the external capacitor Cd is charged, so that the voltage level of the input terminal XI is increased as shown by the solid line of FIG. 13.

If the voltage level of the input terminal XI is increased from an initial state (about 0[V]) and then reaches the vicinity of a threshold voltage Vth of the NMOS transistor 44 included in the oscillating buffer 14, the oscillating buffer 14 is turned on, so that the voltage levels of the input terminal XI and the output terminal XO reach a bias level BIAS as shown in FIG. 13. From such a state, a signal of an oscillation frequency based on the crystal unit Xtal is amplified, so that the oscillator circuit starts to oscillate as shown in FIG. 13.

In the oscillator circuit 100 according to the related art, as shown in FIG. 13, the voltage level of the output terminal XO is increased by the current Iall flowing from the PTAT current source 12. Meanwhile, the increase in the voltage level of the input terminal XI is delayed by a time constant of the feedback resistor Rf and the external capacitor Cg. When the voltage level of the input terminal XI is equal to or less than a threshold voltage Vth of the NMOS transistor included in the oscillating buffer 14, the oscillating buffer 14 cannot operate. Thus, the current Iall from the PTAT current source 12 flows into the output terminal XO.

When a resistance value of the feedback resistor Rf is large, the increase in the voltage level of the input terminal XI is delayed because charging of the external capacitor Cg is delayed, so that the voltage level of the output terminal XO may be increased up to a level exceeding a breakdown voltage level Va of the PMOS transistor 42 and the NMOS transistor 44. As described above, if the voltage level of the output terminal XO exceeds the breakdown voltage level Va of the PMOS transistor 42 and the NMOS transistor 44, these transistors are broken and are always in a conductive state, so that an oscillation operation may be impossible. This problem becomes severe when the PMOS transistor 42 and the NMOS transistor 44 are formed by a core transistor having a breakdown voltage lower than that of an I/O transistor.

SUMMARY

The present invention provides an oscillator circuit capable of preventing an overvoltage from being applied to an oscillating buffer.

According to an exemplary embodiment of the invention, there is provided an oscillator circuit including: a current source; a resonant unit; an oscillation amplification unit connected to the current source while being connected in parallel to the resonant unit; a feedback resistor connected in parallel to the oscillation amplification unit; a bypass resistor having a resistance value lower than a resistance value of the feedback resistor; a switch unit connected between the feedback resistor and the bypass resistor, and configured to switch to the feedback resistor or the bypass resistor; and a control unit configured to control the switch unit such that a current from the current source is bypassed to the bypass resistor during a predetermined oscillation starting period after the current from the current source starts to be supplied to the resonant unit, and to control the switch unit such that the current from the current source flows to the feedback resistor after the predetermined oscillation starting period has ended.

BRIEF DESCRIPTION OF THE DRAWINGS

Exemplary embodiments of the present invention will be described in detail based on the following figures, wherein:

FIG. 13 is a graph illustrating waveforms of each element at the time of an oscillating operation of an oscillator circuit according to the related art.

DETAILED DESCRIPTION

First Embodiment

Figure 1:
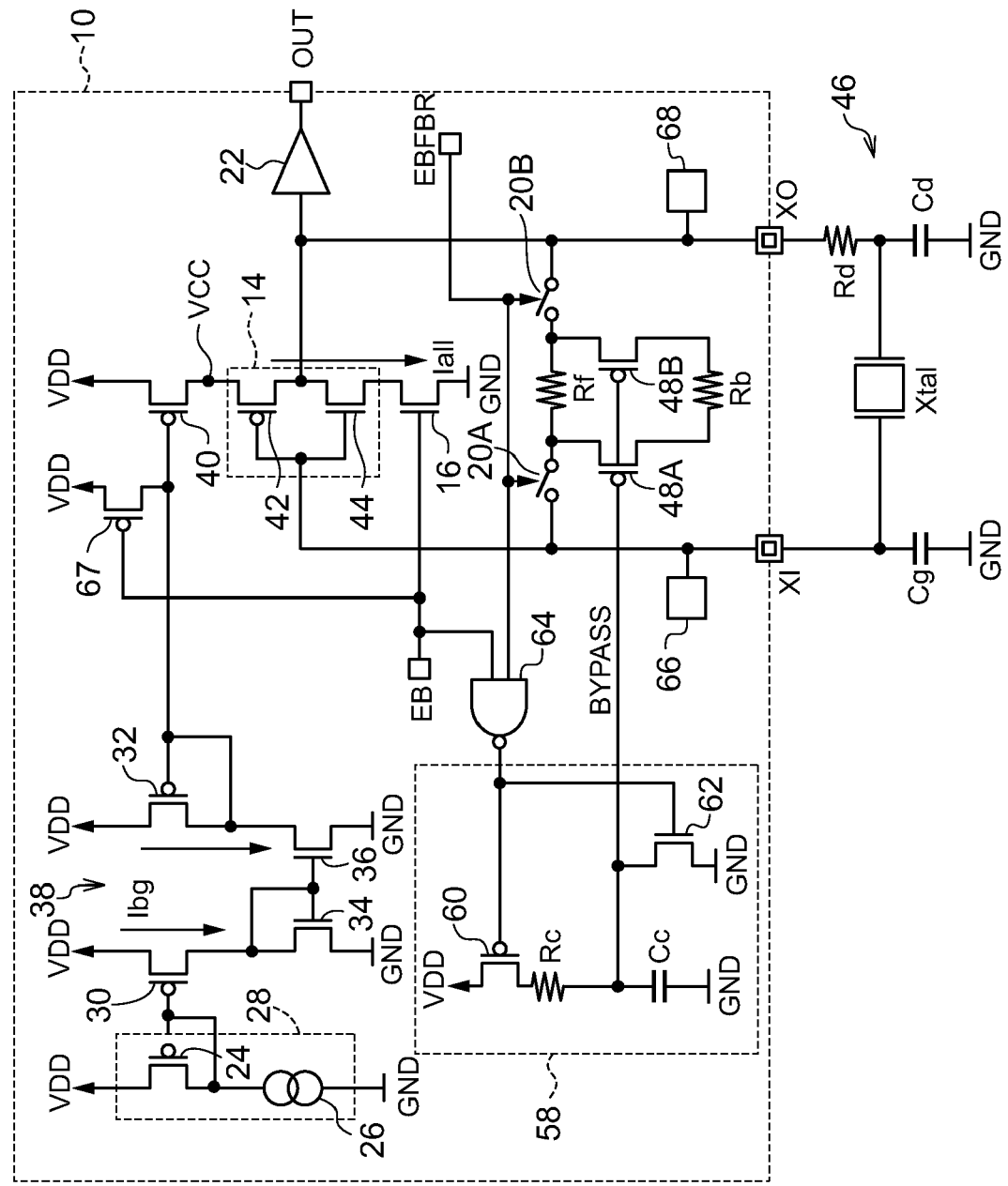
FIG. 1 is a circuit diagram illustrating an oscillator circuit according to a first embodiment.

FIG. 1 is a circuit diagram illustrating the configuration of an oscillator circuit 10 according to the first embodiment of the invention. The same reference numerals are used to designate the same elements as those of an oscillator circuit 100 shown in FIG. 12, and detailed description thereof will be omitted. The following description will be given while focusing on the difference relative to the oscillator circuit 100 shown in FIG. 12.

As shown in FIG. 1, the oscillator circuit 10 includes the bypass resistor Rb having a resistance value lower than that of the feedback resistor Rf. The bypass resistor Rb is connected in parallel to the feedback resistor Rf through PMOS transistors 48A and 48B. As one example, the feedback resistor Rf may have a resistance value of several MΩ and the bypass resistor Rb may have a resistance value of several hundreds of Ω. The value of the bypass resistor Rb is set such that the voltage level of the output terminal XO does not exceed the breakdown voltage level of the PMOS transistor 42 and the NMOS transistor 44 of the oscillating buffer 14 when the oscillator circuit 10 starts to oscillate.

Figure 2:
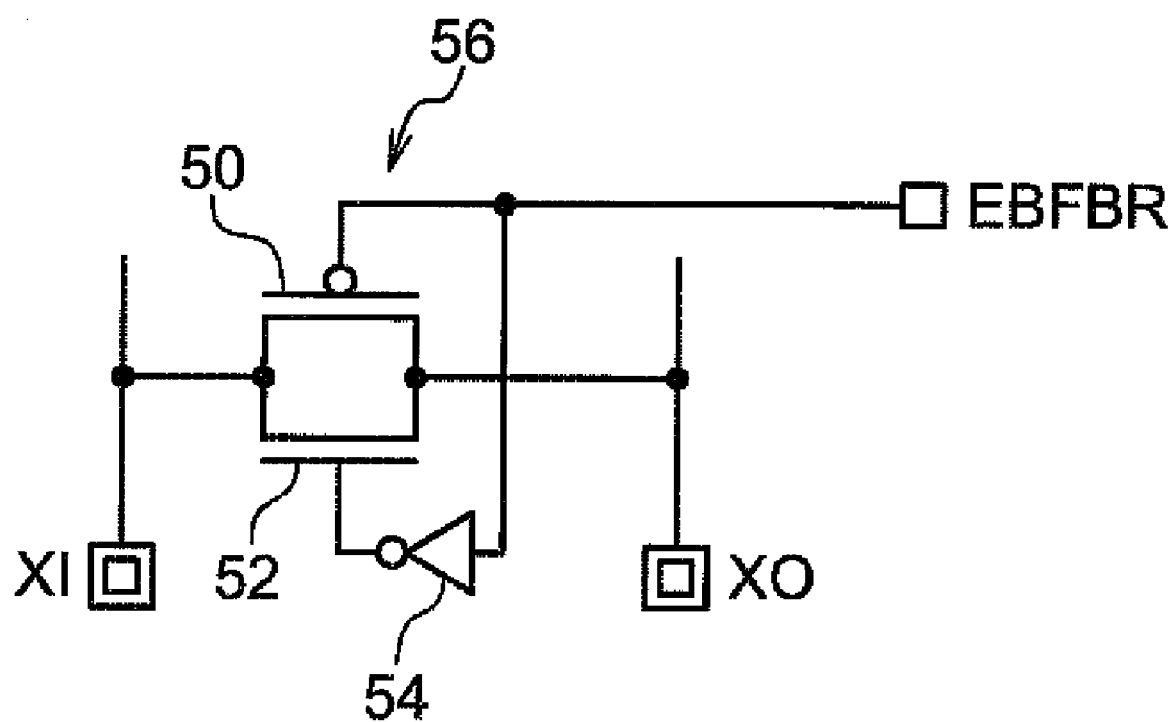
FIG. 2 is a circuit diagram illustrating a transfer gate.

The feedback resistor Rf and the bypass resistor Rb, for example, are formed as an interconnection resistor element (hereinafter, referred to as a POLY resistor) made of polysilicon. Further, the feedback resistor Rf and the bypass resistor Rb may be formed by a transfer gate 56 including a PMOS transistor 50, an NMOS transistor 52 and an inverter circuit 54 as shown in FIG. 2.

Further, when the feedback resistor Rf and the bypass resistor Rb are formed by the POLY resistor, a width of the bypass resistor Rb (low resistance) is set to be wider than a width of the feedback resistor Rf (high resistance) to prevent meltdown. In addition, the transfer gate 56 shown in FIG. 2 has a configuration in which one PMOS transistor 50 is connected in parallel to the NMOS transistor 52. However, the invention is not limited thereto. The transfer gate 56 may have a configuration in which plural PMOS transistors 50 serially connected to each other are connected in parallel to plural NMOS transistors 52 serially connected to each other.

Gates (hereinafter, referred to as a bypass node BYPASS) of the PMOS transistors 48A and 48B are connected to a bypass node charging circuit 58.

As shown in FIG. 1, the bypass node charging circuit 58 includes an RC charging circuit in which a PMOS transistor 60, a resistor Rc and a capacitor Cc are serially connected to each other, and a charging NMOS transistor 62 connected in parallel to the capacitor Cc. For example, the capacitor Cc can be formed with a MIM (Metal-Insulator-Metal) capacitor, a MoM (Metal-Oxide-Metal) capacitor, a gate capacitor of a transistor and the like, which can be formed on a semiconductor integrated circuit.

A gate of the PMOS transistor 60 is connected to an output terminal of an NAND circuit 64. One input terminal of the NAND circuit 64 is connected to an enable terminal EB and a gate of a PMOS transistor 67. The other input terminal of the NAND circuit 64 is connected to a feedback resistor enable terminal EBFBR.

Further, an input protection circuit 66 is provided in the vicinity of the input terminal XI. An output protection circuit 68 is provided in the vicinity of the output terminal XO.

Figure 3:
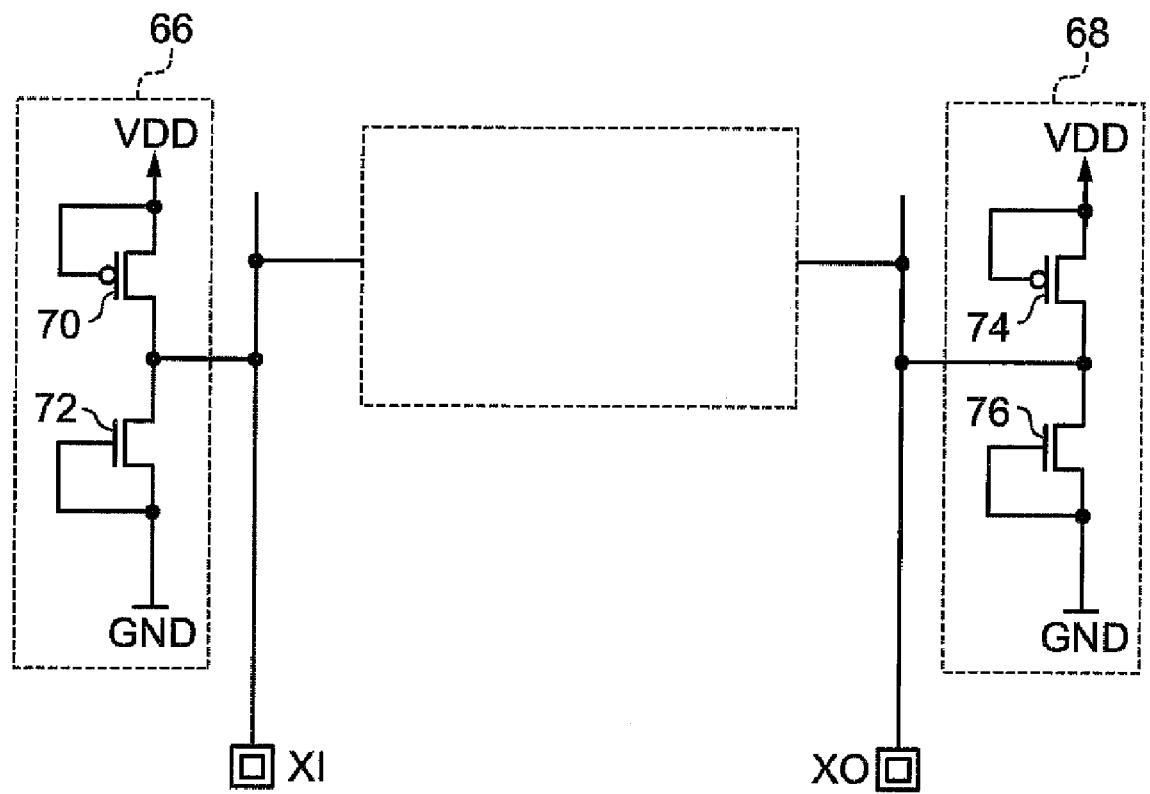
FIG. 3 is a circuit diagram illustrating an input protection circuit and an output protection circuit.

Specifically, in the input protection circuit 66, as shown in FIG. 3, a PMOS transistor 70 is serially connected to an NMOS transistor 72. Moreover, similarly to the input protection circuit 66, in the output protection circuit 68, a PMOS transistor 74 is serially connected to an NMOS transistor 76.

As described above, the input protection circuit 66 is provided in the vicinity of the input terminal XI and the output protection circuit 68 is provided in the vicinity of the output terminal XO, so that an operation of an internal circuit can be prevented from being adversely influenced by noise and the like which is input from the input terminal XI and the output terminal XO.

FIG. 3 illustrates the input protection circuit 66 having a configuration in which the PMOS transistor 70 is serially connected to the NMOS transistor 72. However, a diode may be used instead of the PMOS transistor 70. In such a case, it is preferred that a cathode of the diode is connected to a supply voltage VDD and an anode thereof is connected to the NMOS transistor 72. Further, instead of the PMOS transistor 70 and the NMOS transistor 72, a configuration in which two diodes are serially connected to each other may be employed. In such a case, preferably, the two diodes are serially connected to each other such that cathodes of the two diodes are connected to the supply voltage VDD.

Further, according to the embodiment, switch devices 20A and 20B are formed by NMOS transistors 20A and 20B, respectively. These NMOS transistors serve as ESD (Electrostatic Discharge) protection transistors.

Figure 4:
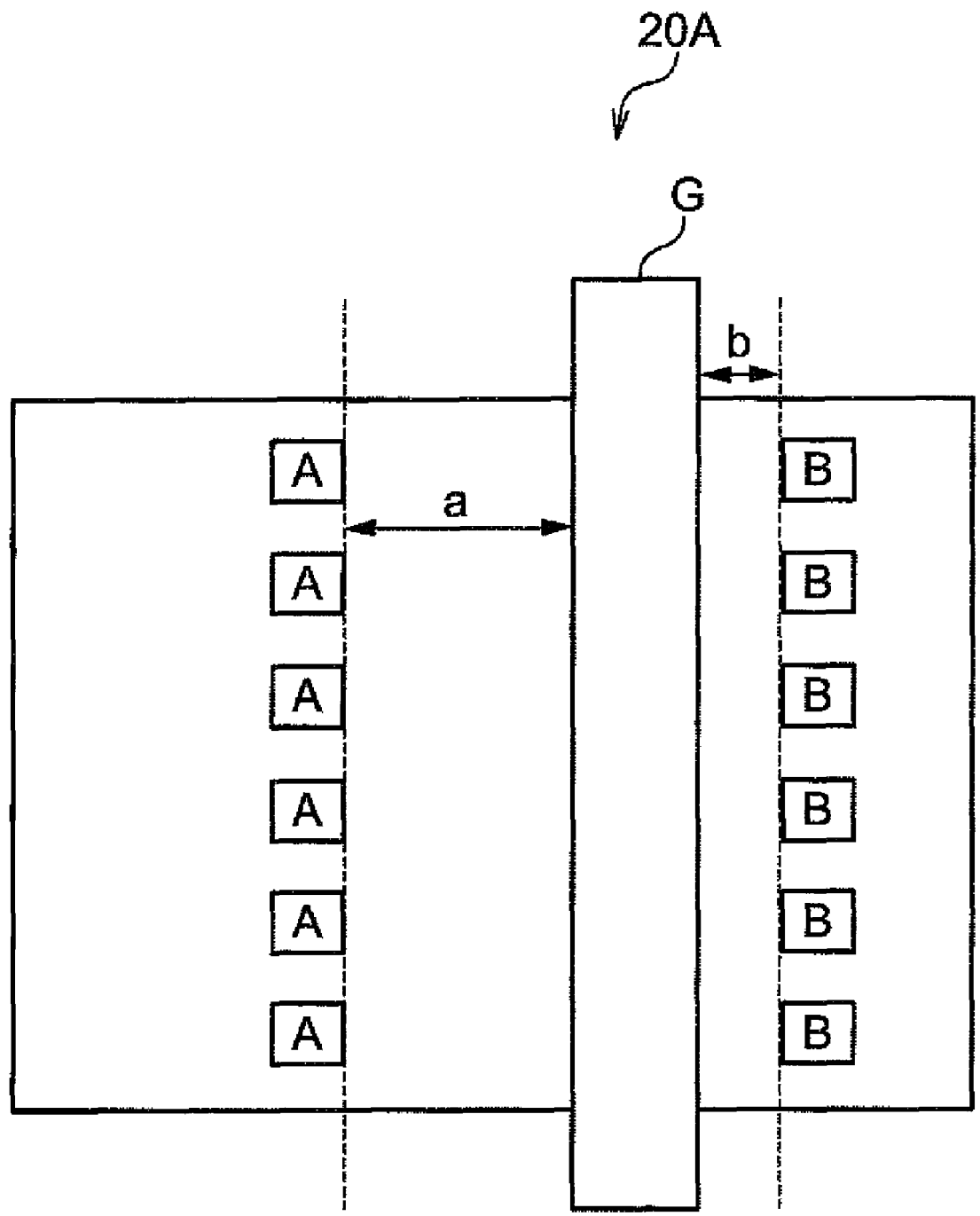
FIG. 4 is a diagram illustrating a MOS transistor layout design as an ESD protection circuit.

Specifically, as shown in FIG. 4, the distance "a" between, for example, a drain terminal A of the NMOS transistor 20A, which is connected to the input terminal XI, and a gate terminal G of the NMOS transistor 20B is longer than the distance "b" between, for example, a source terminal B of the NMOS transistor 20A, which is connected to the feedback resistor Rf, and a gate terminal G of the NMOS transistor 20A.

Similarly to this, the distance "a" between, for example, a drain terminal A of the NMOS transistor 20B, which is connected to the output terminal XO, and the gate terminal of the NMOS transistor 20B is longer than the distance "b" between, for example, a source terminal B of the NMOS transistor 20B, which is connected to the feedback resistor Rf, and a gate terminal B of the NMOS transistor 20B.

The NMOS transistors 20A and 20B each have the above-described configuration, so that the internal circuit can be protected against electrostatic discharging.

Hereinafter, a normal oscillation operation of the oscillator circuit 10 will be described.

Figure 5:
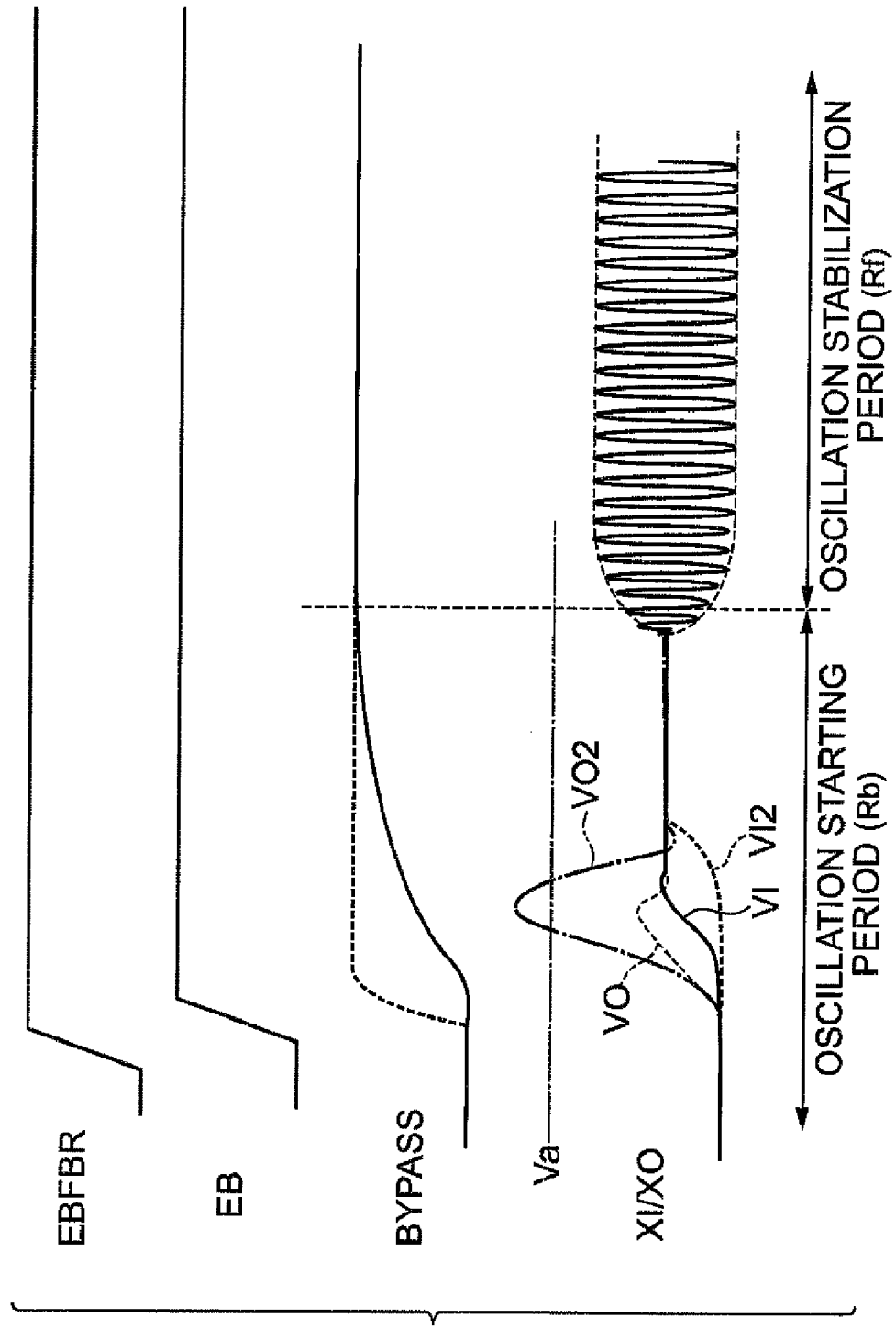
FIG. 5 is a diagram illustrating waveforms of each element when an oscillator circuit performs an oscillating operation.

As shown in FIG. 5, in order to cause the oscillator circuit 10 to oscillate, a control signal input to the feedback resistor enable terminal EBFBR is changed from a low level (hereinafter, referred to an L level) to a high level (hereinafter, referred to an H level), and a control signal input to the enable terminal EB is changed from the L level to the H level, so that the PTAT current source 12 starts to operate.

Thus, the NMOS transistor 16 is turned on and the switch devices 20A and 20B are turned on. Further, the PTAT current source 12 allows the bias current Ibg generated by the bias current generating circuit 28 and the current Iall set by the current mirror circuit 38 to flow.

Further, the feedback resistor enable terminal EBFBR and the enable terminal EB are at the H level, so that output of the NAND circuit 64 is at the L level and the PMOS transistor 60 is turned on. Thus, the capacitor Cc starts to be charged, and a voltage level of the bypass node BYPASS is gradually increased as indicated by a solid line of FIG. 5 without being suddenly increased as indicated by a dotted line of FIG. 5.

Thereafter, the voltage levels of each node (terminal) are changed as follows. First, when the voltage level of the output terminal XO is changed from the initial state to 0 [V] level, the current Iall flows toward the external capacitor Cd from the PTAT current source 12 and is stored in the external capacitor Cd, so that the voltage level VO of the output terminal XO is increased as shown in FIG. 5.

If the voltage level VO of the output terminal XO is increased, the current from the PTAT current source 12 flows toward the input terminal XI through the bypass resistor Rb having a resistance value lower than that of the feedback resistor Rf. As a result, the external capacitor Cg is charged, so that the voltage level VI of the input terminal XI is increased as shown in FIG. 5.

Figure 12:
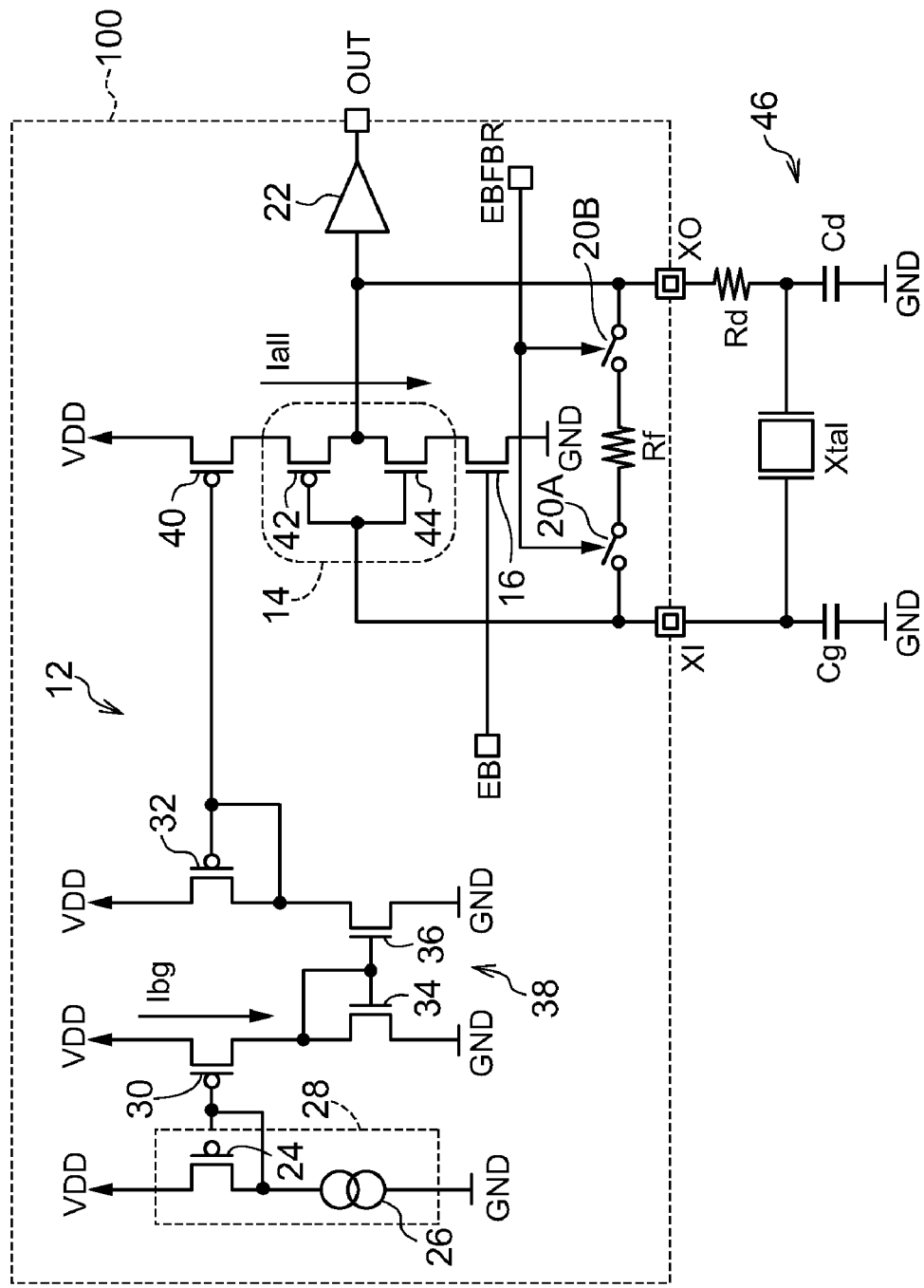
FIG. 12 is a circuit diagram illustrating of an oscillator circuit according the related art.

As described above, when the oscillator circuit 10 starts to oscillate, the current from the PTAT current source 12 flows through the bypass resistor Rb having a low resistance value, so that the voltage level VI of the input terminal XI is not gently increased as in the case of the voltage level of VI2 of the input terminal XI in the existing oscillator circuit 100 shown in FIG. 12, but is rapidly increased. Thus, the voltage level VO of the output terminal XO is not rapidly increased as in the case of the voltage level of VO2 of the output terminal XO in the existing oscillator circuit 100 shown in FIG. 12, but is gently increased. Therefore, the voltage level of VO2 of the output terminal XO does not exceed the breakdown voltage level Va of the PMOS transistor 42 and the NMOS transistor 44, which are core transistors of the oscillating buffer 14, differently from the related art. Consequently, these transistors can be prevented from being broken.

If the voltage level of the input terminal XI is increased from the initial state (about 0[V]) and then reaches the vicinity of the threshold voltage Vth of the NMOS transistor 44 included in the oscillating buffer 14, the NMOS transistor 44 of the oscillating buffer 14 is turned on. Thus, a bias current flows into a ground voltage level GND from the output terminal XO through the NMOS transistors 44 and 16. At this time, the voltage level in the node VCC, which serves as the source of the PMOS transistor 42 of the oscillating buffer 14 is fixed by the current Iall flowing into the NMOS transistor 44 of the oscillating buffer 14 from the PTAT current source 12, and a bias current flowing into the NMOS transistor 44 of the oscillating buffer 14 from the output terminal XO.

Further, the input terminal XI and the output terminal XO have the bias level (same voltage level) of the oscillating buffer 14. Herein, due to the crystal unit Xtal, an oscillation starting-standby state is reached.

Further, after the charging of the capacitor Cc is completed by the RC charging circuit including the resistor Rc and the capacitor Cc, that is, if the voltage level of the bypass node BYPASS exceeds threshold voltages of the PMOS transistors 48A and 48B, the PMOS transistors 48A and 48B are in a non-conductive state. Thus, a current path from the output terminal XO to the input terminal XI through the bypass resistor Rb is blocked. As a result, a resistor between the input terminal XI and the output terminal XO is switched from the bypass resistor Rb to the feedback resistor Rf.

Further, a signal of an oscillation frequency based on the crystal unit Xtal is amplified from the above state, so that the oscillator circuit 10 starts to oscillate as shown in FIG. 5.

In this way, switching is performed from the bypass resistor Rb having a low resistance value to the feedback resistor Rf having a high resistance value, so that oscillation can be stably started.

When the oscillation is completed, the enable terminal EB and the feedback resistor enable terminal EBFBR are at the L level. Thus, a current path to the feedback resistor Rf is blocked and the oscillation is stopped. Further, the NMOS transistor 62 of the bypass node charging circuit 58 is turned on, so that charges stored in the capacitor Cc are discharged.

Next, a time constant $\tau XO$ determined by the resistance value of the bypass resistor Rb and the capacitance value Cd of the capacitor Cd, and a time constant $\tau XI$ determined by the resistance value of the bypass resistor Rb and the capacitance value Cg of the capacitor Cg will be described. Moreover, as one example, the capacitance values Cd and Cg are 16 (pF).

If the time necessary for the charging of the output terminal XO, for example, is defined as a current value 200 μA of the current Iall flowing from the PTAT current source 12, since an output resistance value R is about 16.5 kΩ, the time constant $\tau XO$ is calculated by an equation below.

$$\tau XO = 2.2 \times R \times Cd = 2.2 \times 16.5 \text{ (k}\Omega\text{)} \times 16 \text{ (pF)} \approx 580 \text{ (ns)}$$

In the equation, 2.2 denotes a constant of the formula when a transition time between 10% and 90% of the amplitude of a waveform is calculated, which is calculated by log 0.9–log 0.1.

Herein, if the resistance value of the bypass resistor Rb, for example, is defined as 700Ω, the voltage level of the input terminal XI is sufficiently increased and the time until the oscillating buffer 14 is turned on is set to 70% or more of an amplitude of an oscillation voltage, the time constant $\tau XI$ is calculated by an equation below.

$$\tau XI = 1.9 \times Rb \times Cg = 1.9 \times 700 \times 16 \text{ (pF)} = 21 \text{ ns}$$

In the equation, 1.9 denotes a constant of the formula when a time constant is calculated, which is calculated by log 0.7–log 0.1 because the time until the oscillating buffer 14 is turned on is set to 70% or more of the amplitude of the oscillation voltage.

In this way, the period necessary for the charging of the output terminal XO and the input terminal XI, that is, the period $\tau$ for which the current from the PTAT current source 12 is bypassed to the bypass resistor Rb is calculated by an equation below.

$$\tau = \tau XO + \tau XI \approx 600 \text{ (ns)}$$

When the current from the PTAT current source 12 is bypassed to the bypass resistor Rb by the PMOS transistors 48A and 48B, for example, the period, which is expressed by $\tau$, until the gates of the PMOS transistors 48A and 48B have a voltage of about 0.6 V from 0 V is necessary. The resistance value Rc of the resistor Rc of the bypass node charging circuit 58, which is necessary for ensuring the period, is calculated by an equation below if the capacitance value Cc of the capacitor Cc is set to be about, for example, 1 pF.

$$Rc \geq \tau/Cc = 600 \text{ (ns)}/1 \text{ (pF)} \geq 600 \text{ (k}\Omega\text{)}$$

When $\tau$ is set to 2 (μs) or more in order to ensure a margin, the resistor Rc is calculated by an equation below.

$$Rc = 2 \text{ (μs)}/1 \text{ (pF)} = 2 \text{(M}\Omega\text{)}$$

Hereinafter, the simulation results obtained by an inventor will be described.

First, a case in which Rc=1 (kΩ) and Cc=1.2 (pF) will be described.

In such a case, a time constant $\tau b$ of the bypass node BYPASS is calculated by the equation below.

$$\tau b = 2.2 \times \tau b = Rc \times Cc = 1 \text{ (k}\Omega\text{)} \times 1.2 \text{ (pF)} = 1.2 \text{ (ns)}$$

Figure 6A:
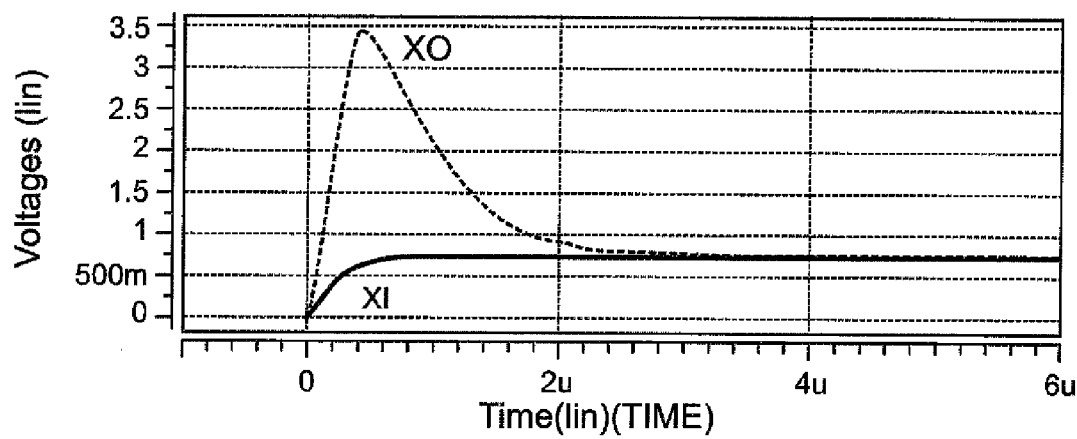
FIG. 6A is a graph illustrating simulation results for waveforms of an oscillation circuit, which illustrates voltage levels of an input terminal XI and an output terminal XO.
Figure 6B:
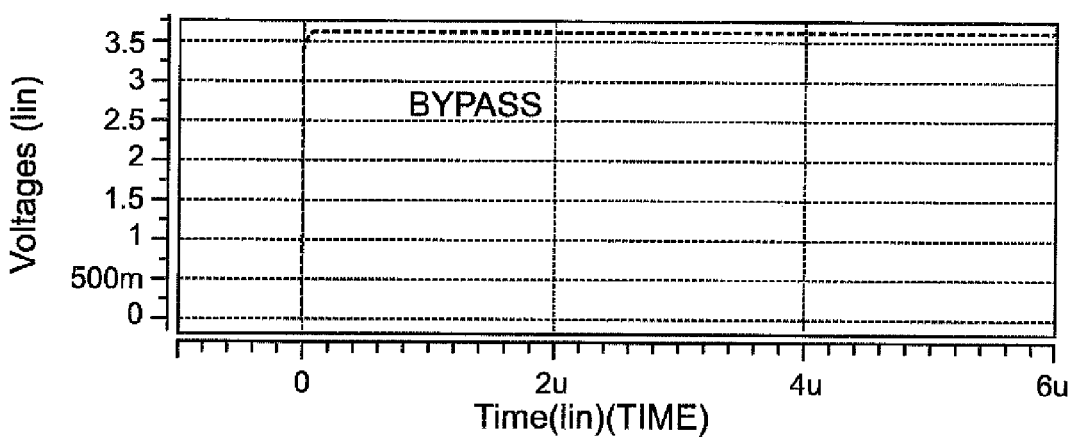
FIG. 6B is a graph illustrating simulation results for waveforms of an oscillation circuit, which illustrates a voltage level of a bypass node BYPASS.
Figure 6C:
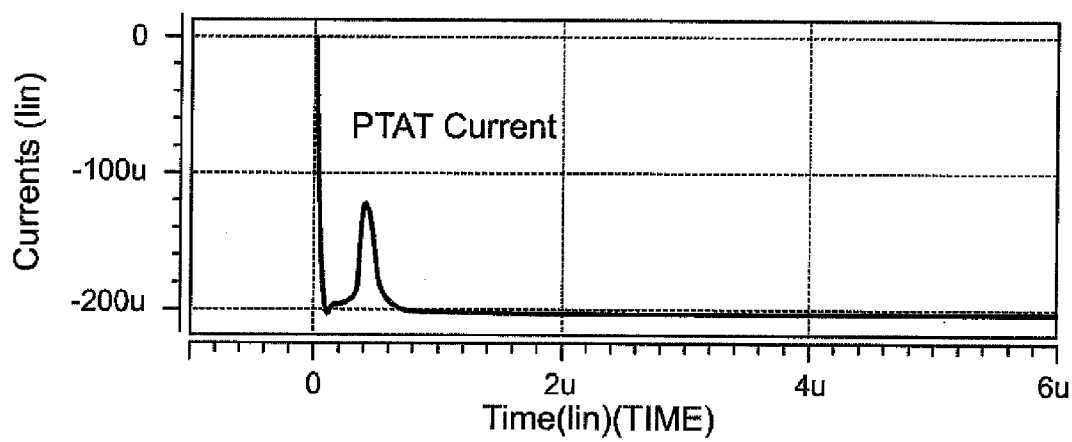
FIG. 6C is a graph illustrating simulation results for waveforms of an oscillation circuit, which illustrates a current from a PTAT current source 12.

FIGS. 6A to 6C illustrate the simulation results in the above case. FIG. 6A illustrates the voltage levels of the input terminal XI and the output terminal XO, FIG. 6B illustrates the voltage level of the bypass node BYPASS, and FIG. 6C illustrates the current from the PTAT current source 12.

As shown in FIG. 6B, since the voltage level of the bypass node BYPASS is immediately increased and the PMOS transistors 48A and 48B are turned on, the switching is immediately performed from the bypass resistor Rb to the feedback resistor Rf. Thus, as shown in FIG. 6A, the charging of the input terminal XI is delayed. Consequently, the voltage level of the output terminal XO exceeds the breakdown voltage level 2.0 V which denotes an overvoltage level.

Next, a case in which Rc=2(MΩ) and Cc=1.2 (pF) will be described.

In such a case, the time constant $\tau b$ of the bypass node BYPASS is calculated by the equation below.

$$\tau b = Rc \times Cc = 2 \text{(M}\Omega\text{)} \times 1.2 \text{ (pF)} = 2.4 \text{ μs}$$

Further, the rising time t of the bypass node BYPASS is calculated by the equation below.

$$t = 2.2 \times Rc \times Cc \approx 5.3 \text{ (μs)}$$

In the equation, 2.2 is calculated by log 0.9–log 0.1 similarly to the above case.

Figure 7A:
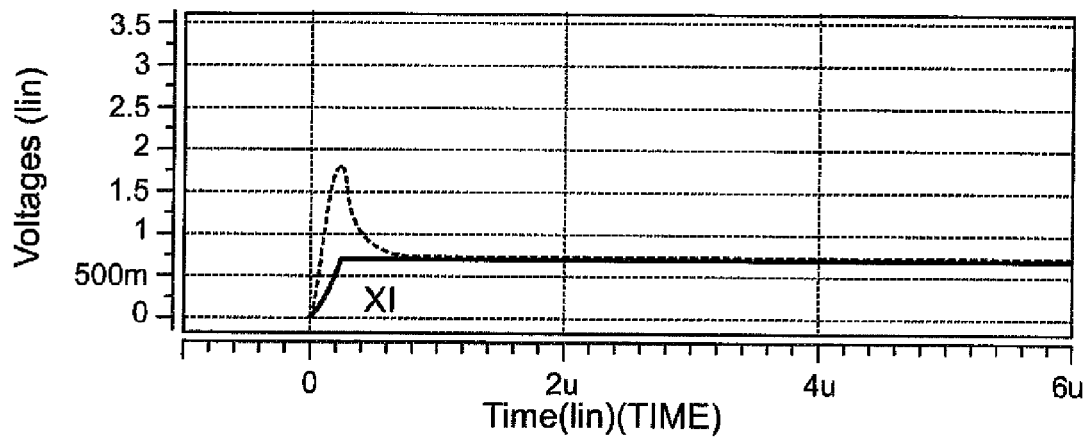
FIG. 7A is a graph illustrating simulation results for waveforms of an oscillation circuit, which illustrates voltage levels of an input terminal XI and an output terminal XO.
Figure 7B:
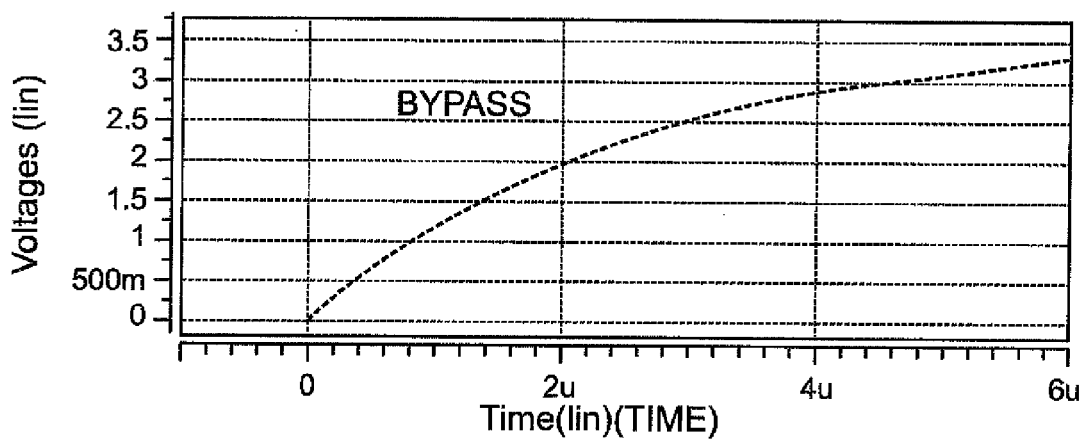
FIG. 7B is a graph illustrating simulation results for waveforms of an oscillation circuit, which illustrates a voltage level of a bypass node BYPASS.
Figure 7C:
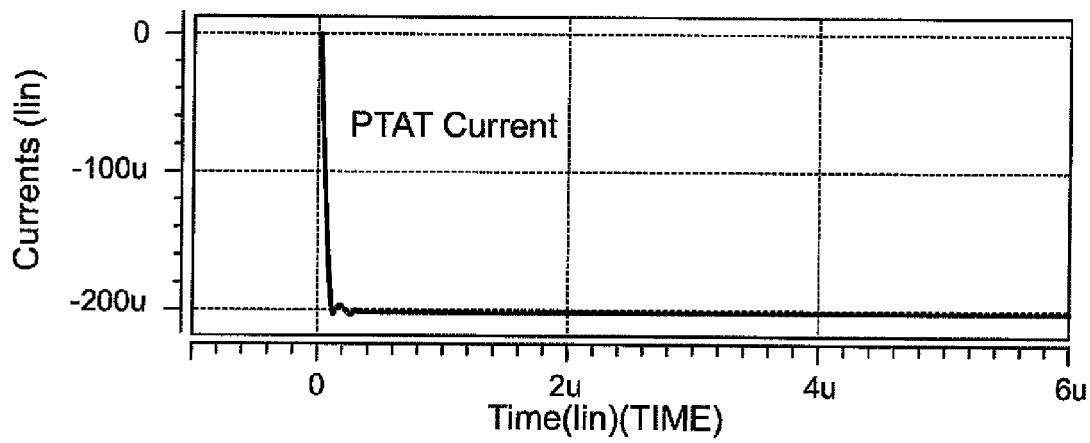
FIG. 7C is a graph illustrating simulation results for waveforms of an oscillation circuit, which illustrates a current from a PTAT current source 12.

FIGS. 7A to 7C illustrate the simulation results in the above case. FIG. 7A illustrates the voltage levels of the input terminal XI and the output terminal XO, FIG. 7B illustrates the voltage level of the bypass node BYPASS, and FIG. 7C illustrates the current from the PTAT current source 12.

As shown in FIG. 7B, since the voltage level of the bypass node BYPASS is gradually increased while not being immediately increased and the PMOS transistors 48A and 48B are turned on, the switching is not immediately performed from the bypass resistor Rb to the feedback resistor Rf. Thus, the input terminal XI is rapidly charged. While the input terminal XI is being charged, a state in which the current from the PTAT current source 12 is bypassed to the bypass resistor Rb is held. Consequently, as shown in FIG. 7A, it can be understood that the voltage level of the output terminal XO is equal to or less than the breakdown voltage level 2.0 V which denotes the overvoltage level.

When the oscillator circuit 10 starts to oscillate, the bypass resistor Rb having a low resistance value is selected, so that the input terminal XI and the output terminal XO can be stable and the oscillation initiation can be rapidly performed. After the oscillation is stabilized, switching to the feedback resistor Rf having a high resistance value is performed. Thus, a stabilized negative resistance is obtained by a formula for cal culating the following negative resistance R by considering the feedback resistor Rf.

$$R=-[gm\cdot\omega^2\cdot Cg\cdot Cd-gm^2\cdot Rf-\omega^2(Cg+Cd)^2/Rf]/[(-\omega^2Cg\cdot Cd+gm/Rf)^2+\omega^2(Cg+Cd)^2/Rf^2]$$

In the above formula, gm denotes mutual conductance of the oscillating buffer 14 and ω denotes an oscillation angular frequency.

Second Embodiment

Next, the second embodiment of the invention will be described. The same reference numerals are used to designate the same elements as those of the first embodiment, and detailed description thereof will be omitted. The following description will be given while focusing on the difference relative to the first embodiment.

Figure 8:
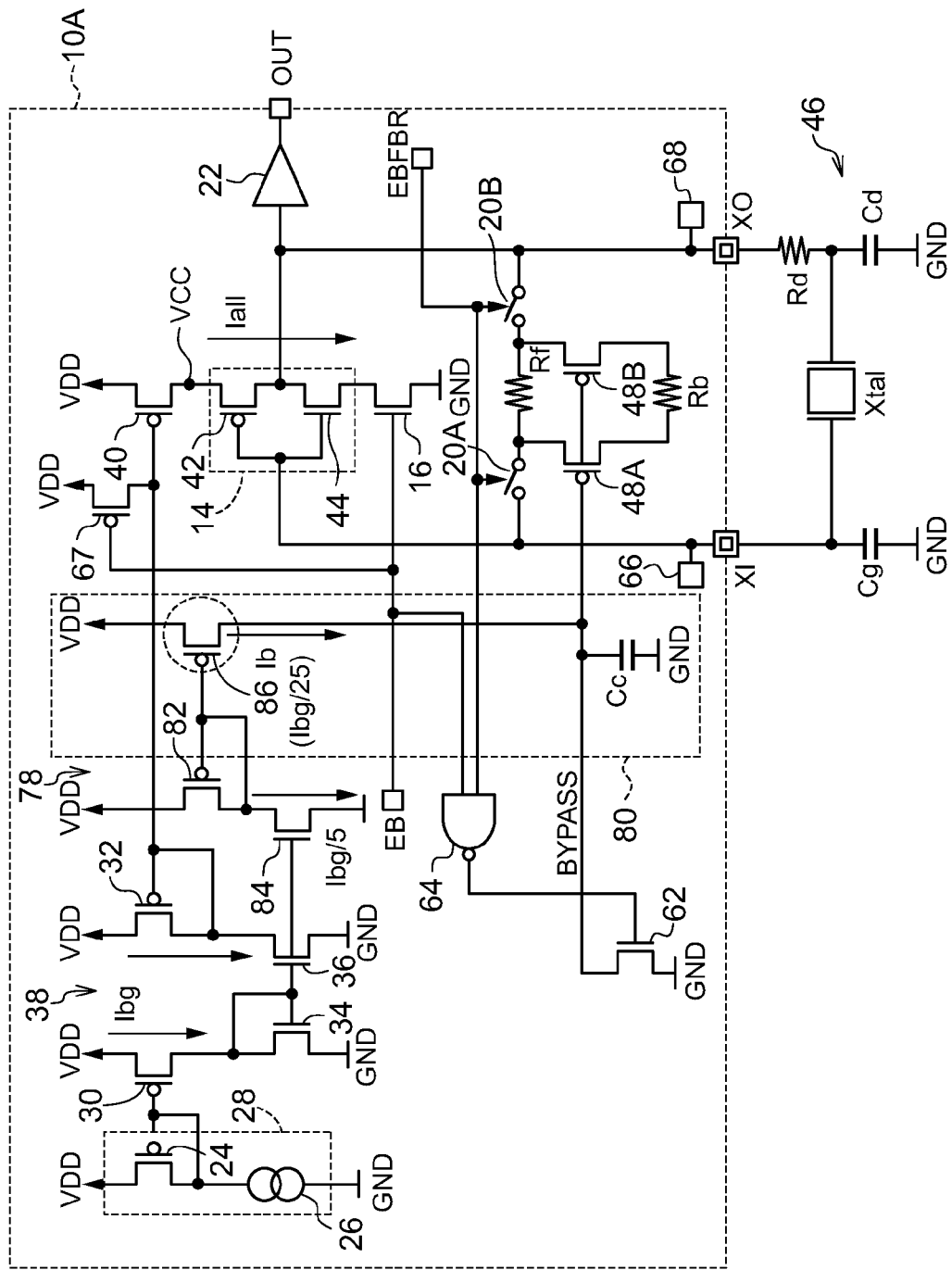
FIG. 8 is a circuit diagram illustrating an oscillator circuit according to a second embodiment.

FIG. 8 illustrates an oscillator circuit 10A according to the embodiment. As shown in FIG. 8, in the oscillator circuit 10A, instead of the bypass node charging circuit 58 of the oscillator circuit 10 shown in FIG. 1, a current mirror circuit 78 is provided. In addition, the bypass node BYPASS is charged by a bypass node charging circuit 80 that constitutes a part of the current mirror circuit 78.

The current mirror circuit 78 is designed such that a current corresponding to 1/N (N is larger than 1) of the bias current Ibg output from the current mirror circuit 38 of the pre-stage of the current mirror circuit 78 flows through a PMOS transistor 82 and an NMOS transistor 84. According to the embodiment, N is defined as 5 as one example. Further, it is designed such that a current corresponding to 1/M (M is larger than N) of the bias current Ibg flows through a PMOS transistor 86 constituting the bypass node charging circuit 80. According to the embodiment, M is defined as 25 as one example.

A current Ib flowing through the bypass node charging circuit 80 has a small value of about several μA. Thus, when the capacitor Cc and the PMOS transistor 86 are disposed or wired while being separated from each other, that is, when wiring for connecting the capacitor Cc to the PMOS transistor 86 is long, during the operation of the oscillator circuit, the bypass node charging circuit 80 may abnormally operate by fluctuation in a power supply voltage level, noise from other circuits and the like. Further, since the PMOS transistor 86 refers to the PTAT current source, the PMOS transistor 86 and the PTAT current source are formed on the same well.

Figure 9:
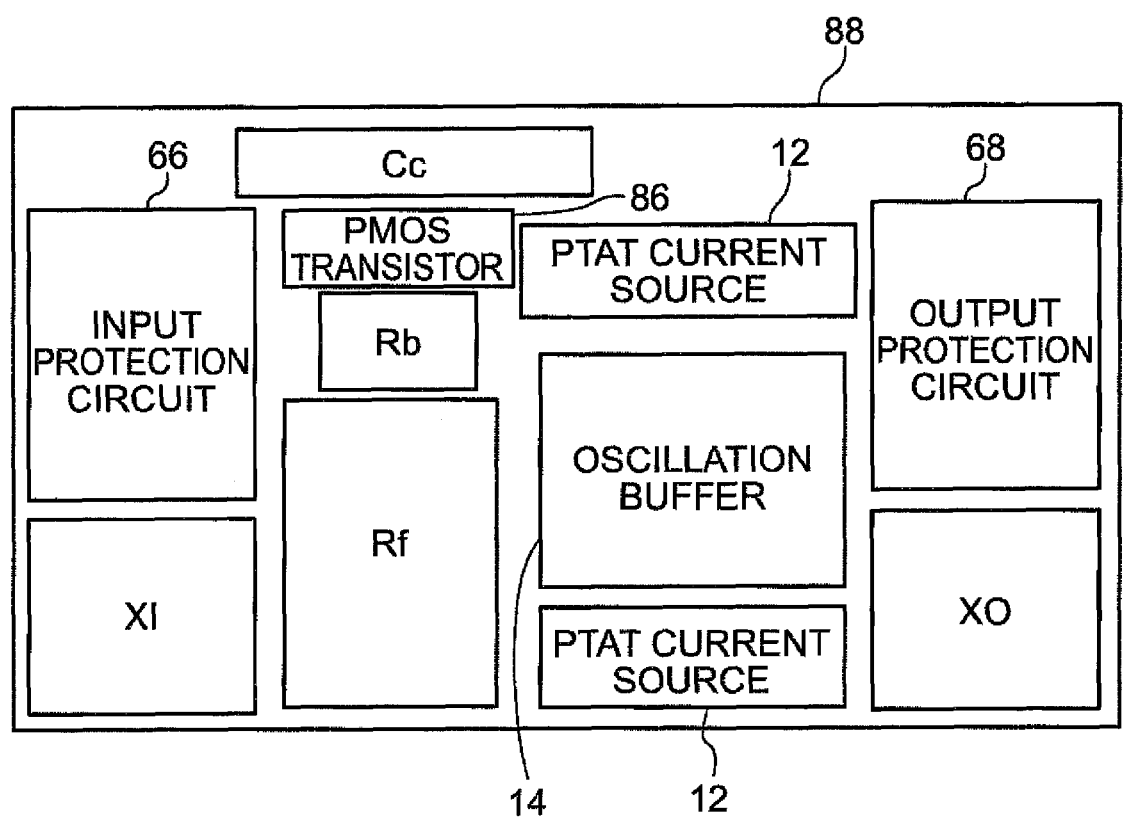
FIG. 9 is a block diagram illustrating a layout of each element of an oscillator circuit according to a second embodiment.

Thus, for example, as shown in FIG. 9, it is preferred that the PMOS transistor 86 of the bypass node charging circuit 80 and the capacitor Cc, for example, are disposed adjacent to each other on a semiconductor substrate 88.

In this way, wiring for connecting the capacitor Cc to the PMOS transistor 86 is shortened, so that an area affected by the fluctuation in a power supply voltage level, noise and the like becomes small. As a result, it is possible to reduce the probability that the bypass node charging circuit 80 will abnormally operate.

Hereinafter, a normal oscillation operation of the oscillator circuit 10A will be described. Voltage levels of each element are substantially identical to those of the first embodiment, except for the bypass node BYPASS.

When the oscillator circuit 10A starts to oscillate, as shown in FIG. 5, a control signal input to the feedback resistor enable terminal EBFBR is changed from a low level (hereinafter, referred to an L level) to a high level (hereinafter, referred to an H level), and a control signal input to the enable terminal EB is changed from the L level to the H level, so that the PTAT current source 12 starts to operate.

Thus, the NMOS transistor 16 is turned on and the switch devices 20A and 20B are turned on. Further, the current Ib corresponding to 1/M (M is 25) of the bias current Ibg generated by the bias current generating circuit 28 flows through the PMOS transistor 86, so that the capacitor Cc is charged. Therefore, the voltage level of the bypass node BYPASS is gradually increased as indicated by a dotted line of FIG. 10.

Thereafter, the voltage levels of each node (terminal) are changed as follows. First, when the voltage level of the output terminal XO is changed from the initial state to 0 [V] level, the current Iall flows toward the external capacitor Cd from the PTAT current source 12 and is stored in the external capacitor Cd, so that the voltage level VO of the output terminal XO is increased as shown in FIG. 5.

If the voltage level VO of the output terminal XO is increased, the current from the PTAT current source 12 flows toward the input terminal XI through the bypass resistor Rb having a resistance value lower than that of the feedback resistor Rf. As a result, the external capacitor Cg is charged, so that the voltage level VI of the input terminal XI is increased as shown in FIG. 5.

If the voltage level of the input terminal XI is increased from the initial state (about 0[V]) and then reaches the vicinity of the threshold voltage Vth of the NMOS transistor 44 included in the oscillating buffer 14, the NMOS transistor 44 of the oscillating buffer 14 is turned on. Thus, a bias current flows into a ground voltage level GND from the output terminal XO through the NMOS transistors 44 and 16. At this time, the voltage level in the node VCC, which serves as the source of the PMOS transistor 42 of the oscillating buffer 14 is fixed by the current Iall flowing into the NMOS transistor 44 of the oscillating buffer 14 from the PTAT current source 12, and a bias current flowing into the NMOS transistor 44 of the oscillating buffer 14 from the output terminal XO.

Further, the input terminal XI and the output terminal XO have the bias level (same voltage level) of the oscillating buffer 14. Herein, an oscillation starting-standby state by the crystal unit Xtal is reached.

After the capacitor Cc is completely charged by the current Ib corresponding to 1/M of the bias current Ibg, that is, if the voltage level of the bypass node BYPASS exceeds the threshold voltages of the PMOS transistors 48A and 48B, the PMOS transistors 48A and 48B are in the non-conductive state. Thus, a current path from the output terminal XO to the input terminal XI through the bypass resistor Rb is blocked. As a result, a resistor between the input terminal XI and the output terminal XO is switched from the bypass resistor Rb to the feedback resistor Rf.

Further, a signal of an oscillation frequency based on the crystal unit Xtal is amplified from the above state, so that the oscillator circuit 10A starts to oscillate as shown in FIG. 5.

In this way, switching is performed from the bypass resistor Rb having a low resistance value to the feedback resistor Rf having a high resistance value, so that oscillation starting can be stably performed.

Figure 10:
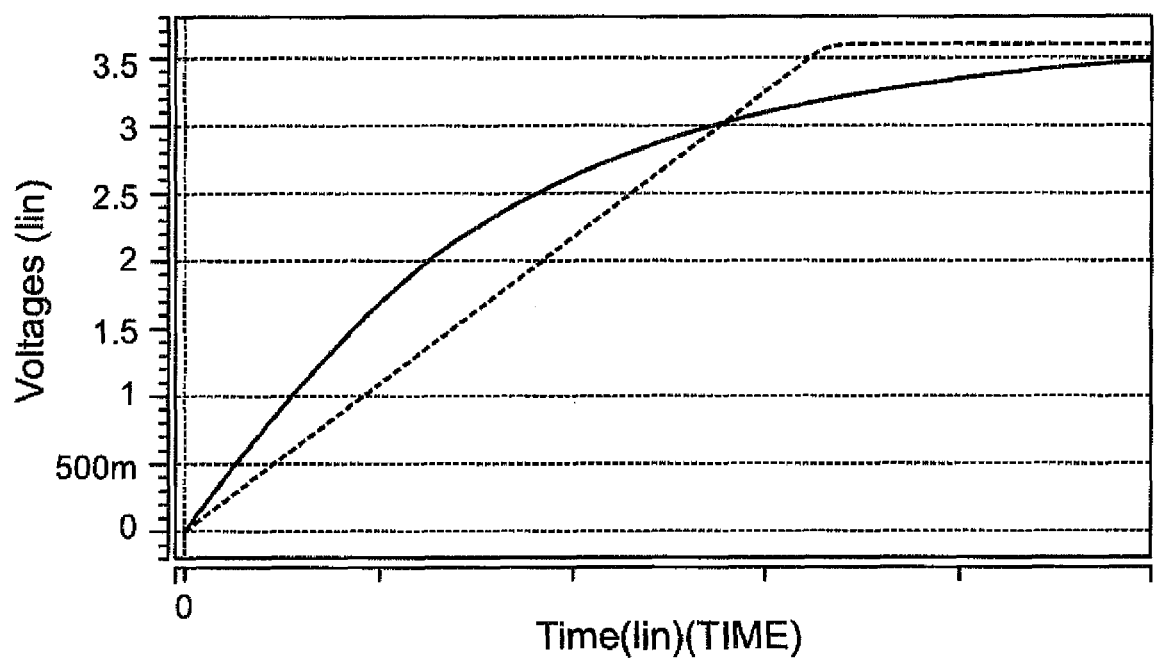
FIG. 10 is a graph illustrating a voltage level of a bypass node of an oscillator circuit according to a second embodiment.

Further, the voltage level of the bypass node BYPASS in the oscillator circuit 10 according to the first embodiment is increased so as to draw a gentle curve as indicated by a solid line of FIG. 10. However, the voltage level of the bypass node BYPASS in the oscillator circuit 10A according to the second embodiment is linearly changed as indicated by a dotted line of FIG. 10. This is because the constant current Ib flows to the capacitor Cc from the current source. Thus, as compared with the first embodiment, a switch timing of the bypass resistor Rb and the feedback resistor Rf is stable.

When the oscillation is completed, the enable terminal EB and the feedback resistor enable terminal EBFBR are at the L level. Thus, a current path to the feedback resistor Rf is blocked and the oscillation is stopped. Further, the NMOS transistor 62 of the bypass node charging circuit 80 is turned on, so that charges stored in the capacitor Cc are discharged.

Third Embodiment

Next, the third embodiment of the invention will be described. The same reference numerals are used to designate the same elements as those of the previous embodiments, and detailed description thereof will be omitted. The following description will be given while focusing on the difference relative to the previous embodiments.

The feedback resistor Rf has a relation of (R∞Rf) with respect to the above-described negative resistance R which represents the characteristics of oscillation operation stabilization. However, when the resistance value of the feedback resistor Rf is lower than a design value, non-oscillation, unstable oscillation (period is not constant) and the like may occur. In this regard, it is necessary to prevent defective products by measuring in advance the feedback resistor Rf before product shipping, and the like.

Thus, during the oscillation operation state, except for a normal operation, that is, in the state in which an L level signal is input to the enable terminal EB, it is necessary to measure the feedback resistor Rf. However, according to the oscillator circuits 10 and 10A described in the first and second embodiments, when the enable terminal EB is at an L level, since the bypass node BYPASS is at the L level, the PMOS transistors 48A and 48B are turned on, so that the bypass resistor Rb is selected. Thus, the resistance value of the feedback resistor Rf cannot be measured.

In this regard, the third embodiment describes an oscillator circuit in which, even if the enable terminal EB is at the L level, the bypass node BYPASS is at a H level and the PMOS transistors 48A and 48B are turned off, so that the feedback resistor Rf is selected.

Figure 11:
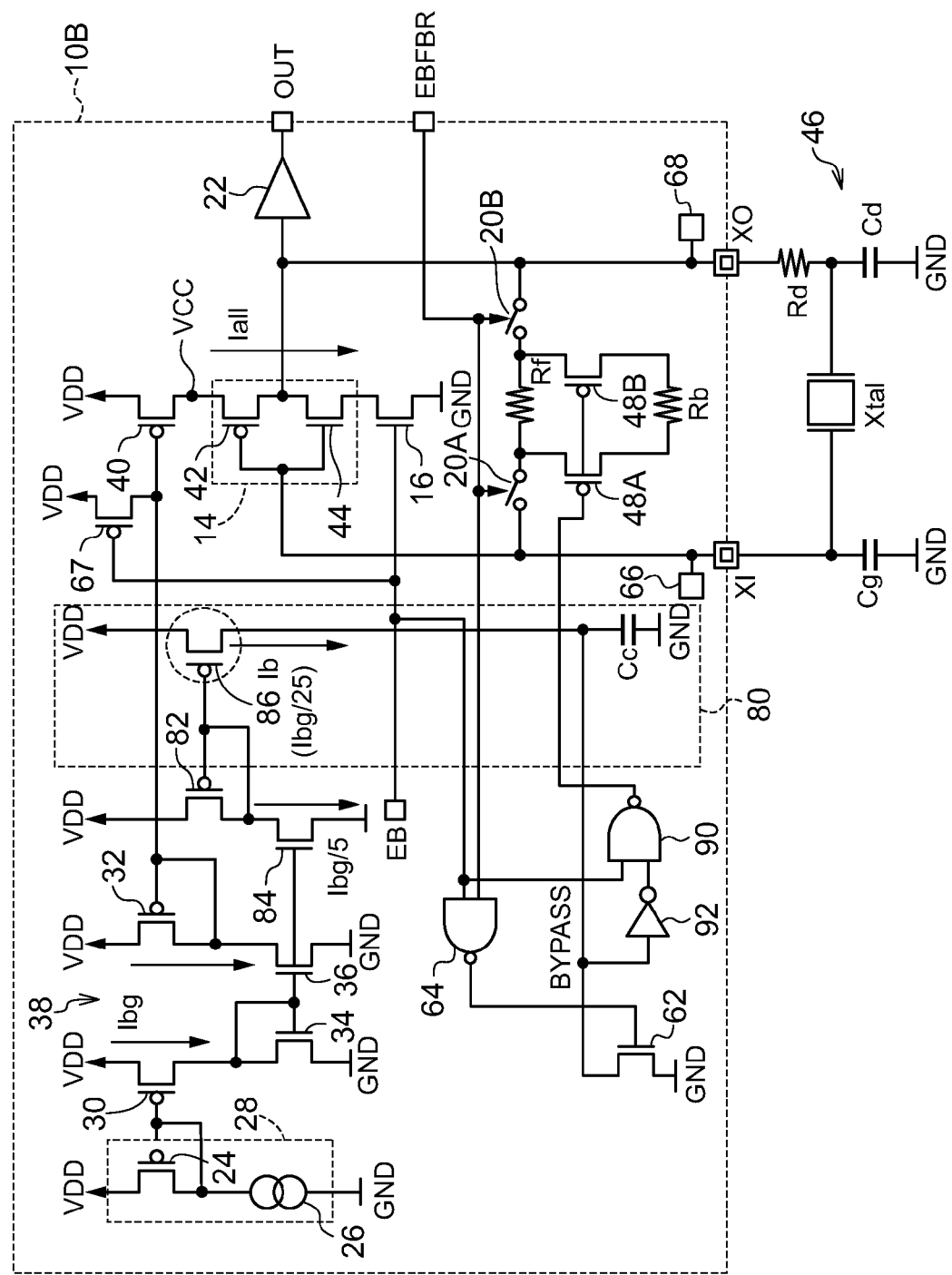
FIG. 11 is a circuit diagram illustrating an oscillation circuit according to a third embodiment.

FIG. 11 illustrates the configuration of such an oscillator circuit 10B. The oscillator circuit 10B is identical to the oscillator circuit 10A shown in FIG. 8, except for an NAND circuit 90 and an inverter 92. The NAND circuit 90 has one input terminal connected to the enable terminal EB and the other input terminal connected to the bypass node BYPASS through the inverter 92. An output terminal of the NAND circuit 90 is connected to the gates of the PMOS transistors 48A and 48B.

With such a configuration, even if the enable terminal EB is at the L level and the bypass node BYPASS is at the L level, output of the NAND circuit 90 is at the H level, so that the PMOS transistors 48A and 48B are turned off. Thus, if the feedback resistor enable terminal EBFBR is at the H level, the switch devices 20A and 20B are turned on, so that switching to the feedback resistor Rf can be performed.

In this way, even if the enable terminal EB is at the L level and the bypass node BYPASS is at the L level, the resistance value of the feedback resistor Rf can be measured.

The previous embodiments describe cases in which the feedback resistor Rf is embedded in the oscillator circuits. However, the invention is not limited thereto. That is, the feedback resistor Rf may be connected to the outside of a semiconductor integrated circuit in which the oscillator circuit is formed, and only the bypass resistor Rb may be embedded in the oscillator circuit. Even in such a case, the above-described effects can be obtained.

At this time, since an effective resistor Rb' of the bypass resistor Rb is connected in parallel to the feedback resistor Rf, when Rb<<Rf, the following equation is satisfied.

$$Rb'=Rf \times Rb/(Rf+Rb) \approx Rf \times Rb/(Rf) \approx Rb$$

According to the oscillator circuit of an exemplary embodiment, the current source may include an I/O transistor, and the oscillation amplification unit may include a CMOS inverter including an N channel MOS transistor and a P channel MOS transistor which are core transistors having a breakdown voltage lower than a breakdown voltage of the I/O transistor.

According to the oscillator circuit of an exemplary embodiment, the switch unit may include plural bypass switch devices which are connected between a first end of the feedback resistor and a first end of the bypass resistor and between a second end of the feedback resistor and a second end of the bypass resistor, and the control unit may include a charging section configured to charge a control terminal of the plural bypass switch devices such that the plural bypass switch devices are switched from an on state to an off state after the predetermined oscillation starting period has ended.

According to the oscillator circuit of an exemplary embodiment, the charging section may include an RC circuit including a resistor and a capacitive element, which are serially connected to each other and have a connection point connected to the control terminal of the plural bypass switch devices, a power supply that supplies power to the RC circuit in the predetermined oscillation starting period, and a discharging unit that discharges charges stored in the capacitive element after the oscillator circuit stops oscillation.

According to the oscillator circuit of an exemplary embodiment, the current source may include a bias current generating circuit, and a current mirror circuit connected to the bias current generating circuit, wherein the charging section is a part of the current mirror circuit and may include a current supply unit that supplies a current corresponding to 1/M (M is larger than 1) of an output current from the bias current generating circuit, and a capacitive element connected to the current supply unit and having a connection point connected to the control terminal of the plural bypass switch devices, and a discharging unit that discharges charges stored in the capacitive element after the oscillator circuit stops oscillation.

The oscillator circuit according to an exemplary embodiment may further include an off signal output unit provided between the charging section and the control terminal of the plural bypass switch devices, which, when a permission signal for permitting supply of the current from the current source to be started is in an off state, outputs an off signal to the control terminal of the plural bypass switch devices to turn off the control terminal of the plural bypass switch devices even if the control terminal of the plural bypass switch devices is turned on by a voltage level of the connection point.

The oscillator circuit according to an exemplary embodiment may further include an off signal output unit provided between the charging section and the control terminal of the plural bypass switch devices, which, when a permission signal for permitting supply of the current from the current source to be started is in an off state, outputs an off signal to the control terminal of the plural bypass switch devices to turn off the control terminal of the plural bypass switch devices even if the control terminal of the plural bypass switch devices is turned on by a voltage level of the connection point.

According to the oscillator circuit of an exemplary embodiment, the current supply unit may include a MOS transistor, the capacitive element may include a capacitor, and the MOS transistor and the capacitor are disposed adjacent to each other.

According to the oscillator circuit of an exemplary embodiment, the capacitive element is any one of a MIM capacitor, a MoM capacitor or a gate capacitor of a transistor on a semiconductor integrated circuit.

The oscillator circuit according to an exemplary embodiment may further include: a first MOS transistor connected between a first end of the feedback resistor and a first end of the resonant unit; and a second MOS transistor connected between a second end of the feedback resistor and a second end of the resonant unit, the first and second MOS transistors being turned on when supply of the current from the current source to the resonant unit is started, wherein a distance from one of a source terminal or a drain terminal of the first MOS transistor which is connected to the first end of the resonant unit, to a gate terminal of the first MOS transistor, is longer than a distance from one of a source terminal or a drain terminal of the first MOS transistor which is connected to the first end of the feedback resistor, to the gate terminal of the first MOS transistor, and a distance from one of a source terminal or a drain terminal of the second MOS transistor which is connected to the second end of the resonant unit, to a gate terminal of the second MOS transistor, is longer than a distance from one of a source terminal or a drain terminal of the second MOS transistor which is connected to the second end of the feedback resistor, to the gate terminal of the second MOS transistor.

The oscillator circuit according to an exemplary embodiment may further include a first protection circuit provided between a first end of the feedback resistor and a first end of the resonant unit, and a second protection circuit provided between a second end of the feedback resistor and a second end of the resonant unit, wherein the first protection circuit is disposed adjacent to a first connection terminal connected to the first end of the resonant unit, and the second protection circuit is disposed adjacent to a second connection terminal connected to the second end of the resonant unit.

According to the oscillator circuit of an exemplary embodiment, the feedback resistor and the bypass resistor include an interconnection resistor or a transfer gate.

According to the oscillator circuit of an exemplary embodiment, the feedback resistor and the bypass resistor include an interconnection resistor made of polysilicon, and an interconnection width of the bypass resistor is wider than an interconnection width of the feedback resistor.

According to an aspect of the invention, an overvoltage can be prevented from being applied to the oscillating buffer. Further, when the oscillator circuit starts to oscillate, the bypass resistor is selected, so that the input terminal and the output terminal of the oscillator circuit can be stable and the oscillation starting can be easily performed without large level of driving. In addition, after the oscillation is stabilized, switching to the feedback resistor having a high resistance value is performed, so that a stabilized negative resistance is obtained by a theoretical formula for calculating the negative resistance by considering the feedback resistor.

What is claimed is:

1. An oscillator circuit comprising:
   a current source;
   a resonant unit;
   an oscillation amplification unit connected to the current source while being connected in parallel to the resonant unit;
   a feedback resistor connected in parallel to the oscillation amplification unit;
   a bypass resistor having a resistance value lower than a resistance value of the feedback resistor;
   a switch unit connected between the feedback resistor and the bypass resistor, and configured to switch in the feedback resistor or the bypass resistor; and
   a control unit configured to control the switch unit such that a current from the current source is bypassed to the bypass resistor during a predetermined oscillation starting period after the current from the current source starts to be supplied to the resonant unit, and to control the switch unit such that the current from the current source flows to the feedback resistor after the predetermined oscillation starting period has ended,
   wherein the switch unit includes a plurality of bypass switch devices which are connected between a first end of the feedback resistor and a first end of the bypass resistor, and between a second end of the feedback resistor and a second end of the bypass resistor, and the control unit includes a charging section configured to charge a control terminal of the plurality of bypass switch devices from an initial voltage to a threshold voltage in a predetermined charging period that is greater than or equal to the predetermined oscillation starting period so that the plurality of bypass switch devices are switched from an on state to an off state after the predetermined oscillation starting period has ended.

2. The oscillator circuit according to claim 1, further comprising:
   a first protection circuit provided between a first end of the feedback resistor and a first end of the resonant unit; and
   a second protection circuit provided between a second end of the feedback resistor and a second end of the resonant unit,
   wherein the first protection circuit is disposed adjacent to a first connection terminal connected to the first end of the resonant unit, and the second protection circuit is disposed adjacent to a second connection terminal connected to the second end of the resonant unit.

3. The oscillator circuit according to claim 1, wherein the feedback resistor and the bypass resistor include an interconnection resistor or a transfer gate.

4. The oscillator circuit according to claim 3, wherein the feedback resistor and the bypass resistor include an interconnection resistor made of polysilicon, and an interconnection width of the bypass resistor is wider than an interconnection width of the feedback resistor.

5. The oscillator circuit according to claim 1, wherein the charging section charges the control terminal such that the voltage of the control terminal increases linearly from the initial voltage to the threshold voltage.

6. The oscillator circuit according to claim 1, wherein the charging section charges the control terminal such that the voltage of the control terminal increases in a smooth curve from the initial voltage to the threshold voltage.

7. An oscillator circuit comprising:
   a current source;
   a resonant unit;
   an oscillation amplification unit connected to the current source while being connected in parallel to the resonant unit;
   a feedback resistor connected in parallel to the oscillation amplification unit;
   a bypass resistor having a resistance value lower than a resistance value of the feedback resistor;
   a switch unit connected between the feedback resistor and the bypass resistor, and configured to switch in the feedback resistor or the bypass resistor; and a control unit configured to control the switch unit such that a current from the current source is bypassed to the bypass resistor during a predetermined oscillation starting period after the current from the current source starts to be supplied to the resonant unit, and to control the switch unit such that the current from the current source flows to the feedback resistor after the predetermined oscillation starting period has ended, wherein the current source includes an I/O transistor, and the oscillation amplification unit includes a CMOS inverter including an N channel MOS transistor and a P channel MOS transistor which are core transistors having a breakdown voltage lower than a breakdown voltage of the I/O transistor.

8. An oscillator circuit comprising:
a current source;
a resonant unit;
an oscillation amplification unit connected to the current source while being connected in parallel to the resonant unit;
a feedback resistor connected in parallel to the oscillation amplification unit;
a bypass resistor having a resistance value lower than a resistance value of the feedback resistor;
a switch unit connected between the feedback resistor and the bypass resistor, and configured to switch in the feedback resistor or the bypass resistor; and
a control unit configured to control the switch unit such that a current from the current source is bypassed to the bypass resistor during a predetermined oscillation starting period after the current from the current source starts to be supplied to the resonant unit, and to control the switch unit such that the current from the current source flows to the feedback resistor after the predetermined oscillation starting period has ended,
wherein the switch unit includes a plurality of bypass switch devices which are connected between a first end of the feedback resistor and a first end of the bypass resistor, and between a second end of the feedback resistor and a second end of the bypass resistor, and the control unit includes a charging section configured to charge a control terminal of the plurality of bypass switch devices such that the plurality of bypass switch devices are switched from an on state to an off state after the predetermined oscillation starting period has ended, and
wherein the charging section includes
an RC circuit including a resistor and a capacitive element, which are serially connected to each other and have a connection point connected to the control terminal of the plurality of bypass switch devices;
a power supply that supplies power to the RC circuit in the predetermined oscillation starting period; and
a discharging unit that discharges charges stored in the capacitive element after the oscillator circuit stops oscillation.

9. The oscillator circuit according to claim 8, further comprising an off signal output unit provided between the charging section and the control terminal of the plurality of bypass switch devices, which, when a permission signal for permitting supply of the current from the current source to be started is in an off state, outputs an off signal to the control terminal of the plurality of bypass switch devices to turn off the control terminal of the plurality of bypass switch devices even if the control terminal of the plurality of bypass switch devices is turned on by a voltage level of the connection point.

10. The oscillator circuit according to claim 8, wherein the capacitive element is any one of a MIM capacitor, a MoM capacitor or a gate capacitor of a transistor on a semiconductor integrated circuit.

11. An oscillator circuit comprising:
a current source;
a resonant unit;
an oscillation amplification unit connected to the current source while being connected in parallel to the resonant unit;
a feedback resistor connected in parallel to the oscillation amplification unit;
a bypass resistor having a resistance value lower than a resistance value of the feedback resistor;
a switch unit connected between the feedback resistor and the bypass resistor, and configured to switch in the feedback resistor or the bypass resistor; and
a control unit configured to control the switch unit such that a current from the current source is bypassed to the bypass resistor during a predetermined oscillation starting period after the current from the current source starts to be supplied to the resonant unit, and to control the switch unit such that the current from the current source flows to the feedback resistor after the predetermined oscillation starting period has ended,
wherein the switch unit includes a plurality of bypass switch devices which are connected between a first end of the feedback resistor and a first end of the bypass resistor, and between a second end of the feedback resistor and a second end of the bypass resistor, and the control unit includes a charging section configured to charge a control terminal of the plurality of bypass switch devices such that the plurality of bypass switch devices are switched from an on state to an off state after the predetermined oscillation starting period has ended,
wherein the current source includes
a bias current generating circuit; and
a current mirror circuit connected to the bias current generating circuit, and
wherein the charging section is a part of the current mirror circuit and includes
a current supply unit that supplies a current corresponding to 1/M (M is larger than 1) of an output current from the bias current generating circuit;
a capacitive element connected to the current supply unit and having a connection point connected to the control terminal of the plurality of bypass switch devices; and
a discharging unit that discharges charges stored in the capacitive element after the oscillator circuit stops oscillation.

12. The oscillator circuit according to claim 11, further comprising an off signal output unit provided between the charging section and the control terminal of the plurality of bypass switch devices, which, when a permission signal for permitting supply of the current from the current source to be started is in an off state, outputs an off signal to the control terminal of the plurality of bypass switch devices to turn off the control terminal of the plurality of bypass switch devices even if the control terminal of the plurality of bypass switch devices is turned on by a voltage level of the connection point.

13. The oscillator circuit according to claim 11, wherein the current supply unit includes a MOS transistor, the capacitive element includes a capacitor, and the MOS transistor and the capacitor are disposed adjacent to each other.

14. An oscillator circuit comprising:
a current source;
a resonant unit;
an oscillation amplification unit connected to the current source while being connected in parallel to the resonant unit;
a feedback resistor connected in parallel to the oscillation amplification unit;
a bypass resistor having a resistance value lower than a resistance value of the feedback resistor;
a switch unit connected between the feedback resistor and the bypass resistor, and configured to switch in the feedback resistor or the bypass resistor;
a control unit configured to control the switch unit such that a current from the current source is bypassed to the bypass resistor during a predetermined oscillation starting period after the current from the current source starts to be supplied to the resonant unit, and to control the switch unit such that the current from the current source flows to the feedback resistor after the predetermined oscillation starting period has ended;
a first MOS transistor connected between a first end of the feedback resistor and a first end of the resonant unit; and
a second MOS transistor connected between a second end of the feedback resistor and a second end of the resonant unit, the first and second MOS transistors being turned on when supply of the current from the current source to the resonant unit is started,
wherein a distance from one of a source terminal or a drain terminal of the first MOS transistor which is connected to the first end of the resonant unit, to a gate terminal of the first MOS transistor, is longer than a distance from one of a source terminal or a drain terminal of the first MOS transistor which is connected to the first end of the feedback resistor, to the gate terminal of the first MOS transistor, and
wherein a distance from one of a source terminal or a drain terminal of the second MOS transistor which is connected to the second end of the resonant unit, to a gate terminal of the second MOS transistor, is longer than a distance from one of a source terminal or a drain terminal of the second MOS transistor which is connected to the second end of the feedback resistor, to the gate terminal of the second MOS transistor.

* * * * *